(12) United States Patent
Butler (10) Patent No.: US 7,071,778 B2
(45) Date of Patent: Jul. 4, 2006

(54) HIGH-SPEED LOW-POWER DYNAMIC CURRENT BIASED OPERATIONAL AMPLIFIER

(75) Inventor: Iain Christopher Butler, Santa Cruz, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 40 days.

(21) Appl. No.: 10/805,050

(22) Filed: Mar. 18, 2004

(65) Prior Publication Data

US 2004/0212431 A1 Oct. 28, 2004

Related U.S. Application Data

(60) Provisional application No. 60/465,947, filed on Apr. 28, 2003.

(51) Int. Cl.
*H03F 3/45* (2006.01)

(52) U.S. Cl. ........................ 330/253; 330/261

(58) Field of Classification Search .............. 330/253, 330/261, 257, 258; 327/359
See application file for complete search history.

(56) References Cited

U.S. PATENT DOCUMENTS

| | | | |
|---|---|---|---|
| 4,284,957 A | 8/1981 | Hague | 330/253 |
| 4,335,355 A | 6/1982 | Hague | 330/253 |
| 5,084,683 A | 1/1992 | Nicollini | 330/107 |
| 5,598,129 A * | 1/1997 | Chambers | 330/255 |
| 5,990,741 A * | 11/1999 | Yamamoto et al. | 330/253 |
| 6,377,120 B1* | 4/2002 | Hsieh | 330/253 |
| 6,462,695 B1 | 10/2002 | Ahuja et al. | 341/161 |
| 6,504,432 B1 | 1/2003 | Rokhsaz | 330/258 |
| 6,522,200 B1* | 2/2003 | Siniscalchi | 330/254 |
| 6,552,676 B1 | 4/2003 | Bjorksten et al. | 341/143 |
| 6,624,698 B1* | 9/2003 | Nagaraj | 330/258 |
| 6,724,258 B1* | 4/2004 | Fayed | 330/260 |
| 6,753,732 B1* | 6/2004 | Moreland | 330/261 |
| 2002/0036519 A1 | 3/2002 | Krishnapura et al. | 327/65 |

FOREIGN PATENT DOCUMENTS

| | | |
|---|---|---|
| EP | 0 375 017 | 6/1990 |
| JP | 2219314 | 8/1990 |

OTHER PUBLICATIONS

IEEE Transactions on Circuits and Systems, vol. 40, No. 4, Apr. 1993, p. 258-262, "Highly Linear Voltage-Controlled CMOS Transconductors", Stainslaw Szczepanski, Adam Wyszynski, Rolf Schaumann.

(Continued)

*Primary Examiner*—Henry Choe
(74) *Attorney, Agent, or Firm*—Haverstock & Owens LLP (57) ABSTRACT

A high-speed low-power dynamic current biased operational amplifier (Op-amp) for use in switched capacitor circuits. The system and method reduces current in the reset process of the switched capacitor circuit's operation, while maintaining the drive current required for fast settling in the amplification process. The system and method significantly lowers the power consumption of the switched capacitor circuit, while overcoming the main issues related to dynamic current biasing in an Op-amp, common-mode feedback interaction, using architecture other than the standard differential input stage of a normal Op-amp.

45 Claims, 5 Drawing Sheets

OTHER PUBLICATIONS

Peter Peregrinus Ltd, 1998, Chapter 5.3, p. 193, "Analogue IC Design: the current -mode approach", C. Toumazou, F.J.Lidgey, D.G. Haigh.

IEEE Journal of Solid State Circuits, vol. 24, No. 3, Jun. 1989, p. 803, "High-Frequency Fully Differential Filter Using Operational Amplifiers Without Common-Mode Feedback", Germano Nicollini, Francesco Moretti, Mauro Conti.

IEEE Journal of Solid State Circuits, vol. 34, No. 7, Jul. 1999, p. 921 "A 16mW, 120dB Linear Switched Capacitor Delta-Sigma Modulator with Dynamic Biasing", Dan Kasha, Wai Lee, Axel Thomsen.

ISPLED 1998, Aug. 10-12, 1998, Monterey, CA USA, p. 203. "On the Optimum Design of Regulated Cascode Operational Transconductance Amplifiers", Thomas Burger, Quiting Huang.

IEEE Journal of Solid State Circuits, vol. 25, No. 6, Dec. 1990, p. 1379, "A Fast Settling CMOS Op Amp for SC Circuits with 90dB DC Gain", Klass Bult, Govert Geelen.

IEEE Journal of Solid State Circuits, vol. 33, No. 12, Dec. 1998, p. 2010, "A High-Swing CMOS Telescopic Operational Amplifier", Kush Gulati, Hai-Seung Lee.

IEEE Journal of Solid State Circuits, vol. 17, No. 3, Jun. 1982, p. 522, "Adaptive Biasing CMOS Amplifiers", Marc Degrauwe, Jozef Rijmenants, Eric Vittoz, Hugo De Man.

IEEE Journal of Solid State Circuits, vol. 20, No. 6, Dec. 1985, p. 1122, "A High-Performance Micropower Switched Capacitor Filter", Rinaldo Castello, Paul Gray.

IEEE Journal of Solid State Circuits, vol. 24, No. 3, Jun. 1989, p. 744, "A Very-High-Slew-Rate CMOS Operational Amplifier", R. Klinke, B Hosticks, H Pfleiderer.

IEEE Journal of Solid State Circuits, vol. 34, No. 2, Feb. 1999, p. 134, "An Integrated Low-Voltage Class AB CMOS OTA", Ramesh Harjani, Randy Heineke, Feng Wang.

IEEE Journal of Solid State Circuits, vol. 15, Oct. 1980, p. 887, Dynamic CMOS Amplifiers, Bedrich Hosticka.

IEEE Journal of Solid State Circuits, vol. 17, No. 3, Jun. 1982, p. 499, "Real-Time Programmable Low Power SC Bandpass Filter", B Hosticka, D Herbst, B Hoeflinger, U Kleine, J Pandel, R Schweer.

US 6,529,069, 03/2003, Krishnapura et al. (withdrawn)

* cited by examiner

HIGH-SPEED LOW-POWER DYNAMIC CURRENT BIASED OPERATIONAL AMPLIFIER

RELATED APPLICATIONS

This Patent Application claims priority under 35 U.S.C. § 119(e) of the U.S. provisional application Ser. No. 60/465,947 filed on Apr. 28, 2003 and entitled "INVESTIGATION TO REDUCE POWER OF AMP1 & AMP2 FOR 14-BIT TWO-STEP ADC PROJECT." The provisional application Ser. No. 60/465,947 filed on Apr. 28, 2003 and entitled "INVESTIGATION TO REDUCE POWER OF AMP1 & AMP2 FOR 14-BIT TWO-STEP ADC PROJECT," is also hereby incorporated by reference.

FIELD OF THE INVENTION

The present invention relates to the field of switched capacitor circuits. More particularly, the present invention relates to implementing high-speed low-power dynamic current biased operational amplifiers in switched capacitor circuits.

BACKGROUND

The majority of consumer products today use high speed digital processing to improve feature sets and product quality, such as digital video (DV.) However the sensor interface to these products is generally of an analog nature, thus a conversion from analog to digital domains is required. To attain the perceived high quality of the product, the converted data must also be of high quality and therefore high-resolution high-speed converter devices are required. These analog to digital converters (ADCs) convert the analog signals from sensors or transducers, such as charge-coupled devices (CCD) into digital format for later digital signal processing.

Although many different architectures of ADCs exist, such as flash, two-step and pipelined, the optimal architecture for power-resolution-size-cost is based on switched capacitor techniques. The use of switched capacitor design allows high resolution ADCs with moderate speeds with small die areas. The core of a switched capacitor design is an operational amplifier (Op-amp). The characteristics of the Op-amp determine the switched capacitor performance and thus ADC overall performance. The Op-amp must possess the following characteristics. It should also be noted while the Op-amp is herein defined with respect to ADC design, the following Op-amp needs can also be attributed to any switched capacitor circuit application.

Switched capacitor design relies on the switching of capacitors in feedfoward and feedback arrangements around an Op-amp with Gain, to cause charge movement from one element to another. Switched capacitor filters, gain stages, sample-and-holds, are typically designed around how the capacitors are arranged and the timing and order they are switched. To ensure maximal charge movement between elements, the Op-amp gain needs to be extremely high (from basic Op-amp theory.) For the purposes of high resolution ADCs, in excess of 70 dB DC gain is normally required.

The speed at which the ADC can start to sample, convert and then transfer its digital representation to the digital section is termed its conversion time. In a switched capacitor converter design, this conversion time is mainly defined by how fast the Op-amp settles to its final value to within a defined accuracy. High resolution high speed converters require short settling times in the order of nanoseconds to within 0.1% final accuracy or better.

Due to the handheld nature of a significant number of consumer products, battery life is paramount, thus ADC device power dissipation should be minimal. This can be minimized by system architecture, such as with switched capacitor pipelined ADC over Flash ADC. However, in the switched capacitor circuit, the defining single power dissipater is the Op-amp. The reason for this is based on the general laws of physics, which require charge to be moved from one capacitor to another. The more charge to be transferred, the more power is dissipated. Also, the more often or frequent the charge transfer occurs also determines that more power is dissipated. High-speed high-resolution converters require large capacitors to lower noise (kT/C noise) and increase resolution, thus large charge transfers are required. Also high speeds require fast conversion times, which equates to fast settling (high speed) to high final accuracy (high resolution.) Again, this means significant power is required.

The lifecycles of consumer products are generally short and also tend to be competitive, thus product volumes should be high, while general margins are driven low by market demands. This requires high yields from all devices in the product so that margins can be attained. Switched capacitor circuits due to their inherent use of a reference clock, mean that their overall performance stability is significantly higher than pure analog approaches. However, the analog components within a switched capacitor circuit will still be affected by process, temperature and voltage variations and thus can reduce yields. The main yield definer in the switched capacitor circuit is the Op-amp as this is the single biggest analog sub-block in the converter design. To thus attain high yield of the ADC device, the Op-amp should be insensitive to process, temperature and voltage variations.

The useful resolution of an ADC is determined by its dynamic range, which defines the difference between the largest and smallest signals that it can process. A number of factors define dynamic range such as supply voltage and ADC architecture. The power supply voltages and how near the Op-amp's voltage outputs can swing towards these voltages define large signal handling. The use of fully differential Op-amp designs helps increase large signal handling. The lower signal handling is defined by capacitor noise (kT/C) and Op-amp input referred noise. Again, differential design of the Op-amp is also beneficial in rejection of common-mode noise. As such, the Op-amp is a key element in defining the dynamic range of the ADC. The Op-amp should have large signal handling capability, but with low noise.

Consumer products require large volumes, while competitive products and customer demands force low margins. As such, for a product to be successful in a market, it must attain high yields while being cheap to manufacture. This is true for all sub-blocks and as such the die size of the ADC should be small. As the switched capacitor Op-amps and capacitors are a significant size in the overall ADC layout, size reduction of these elements equates to lower overall final cost of the ADC and the final product. Smaller die size also helps in reducing packaging costs, with the inherent cost savings.

High resolution ADCs are needed for consumer and other product groups. In switched capacitor ADC design, the Operational Amplifier (Op-amp) is the key-defining element affecting overall ADC performance and cost. The Op-amp should have high gain, fast settling to a high final accuracy, low power dissipation, capable of driving large capacitive loads, have high yields, handle large and small signals to obtain high dynamic range, be differential to aid in noise suppression and improve dynamic range, while being physically small to lower die size and reduce costs.

Generally speaking, all the above criteria can be met, however each target would normally be achieved by increasing power dissipation. In fact, present operational amplifiers in switched capacitor circuits can not meet all of the above criteria without increasing the power dissipation.

Figure 1:
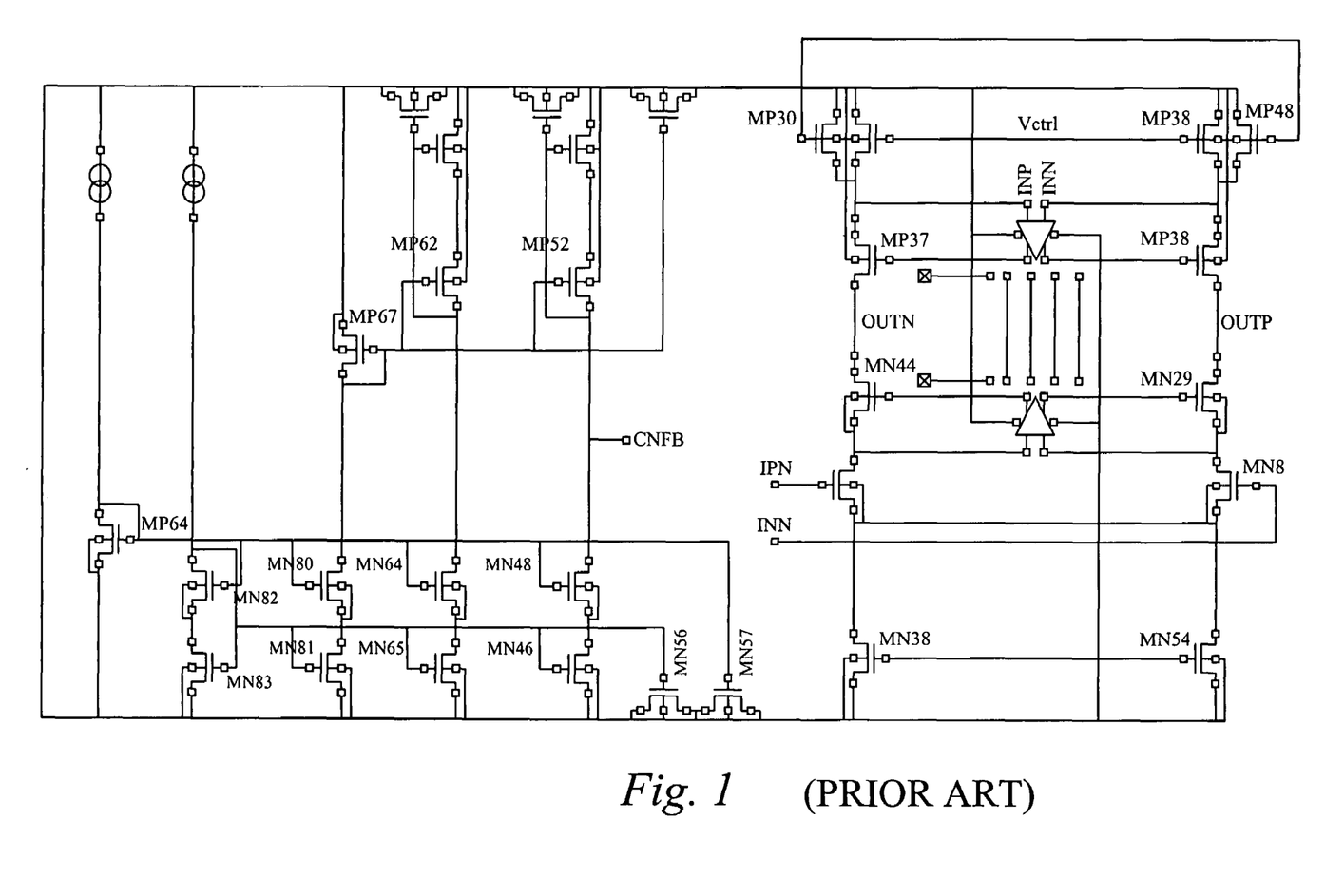
FIG. 1 illustrates a schematic diagram of the prior art.

Normally to meet the needs as defined above, a single stage folded-cascode differential Op-amp with gain-enhancement is utilized. However, this design wastes current in the folding and would require additional current for a single switched capacitor gain stage. To reduce the current consumption and achieve 100% power efficiency, a stacked telescopic gain-enhanced architecture is more preferable. Such a telescopic Op-amp of the prior art is depicted in FIG. 1. The anticipated current consumption for this type of architecture is 3.7 mA @ 3V for a telescopic design running at sub 100 Msps. The disadvantages are headroom issues due to the stacking, thus control of the common-mode input and output levels is important, as well as the bias points of the gain-enhancement stages.

Different solutions have been attempted to improve over the telescopic Op-amp design, which is known to one skilled in the art as a Classic Class A design. In Class AB designs, the bias current of the amplifier is increased in proportion to the amplitude of the input signal. The advantage of this technique is that the charge to be transferred in the switched capacitor circuit is related to the input signal voltage. As such, for small voltage swings, small charge transfers are required, thus lower bias currents can be used. The disadvantage is that the amplifier must react on a sample to sample basis and change its bias current accordingly. As the amplitude of two adjacent samples could span the whole dynamic range, the amplifier bias system must react fast without affecting settling.

Further prior art solutions include reducing the power using a form of self-correcting biasing, which is integrated into the Common-Mode Feedback (CMFB) system. The advantage as expected is lower power dissipation. However, this is outweighed by the fact that CMFB and bias loops due to loop dynamics must meet stability criteria, which normally adversely affects settling time.

In further prior art solutions, dynamic current biasing is used to increase the Op-amp current in the sample phase and decrease current in the hold phase of a switched capacitor circuit operation. As this is timed from the switched capacitor clock, it does not involve any loops and is thus easy to implement. However, no CMFB is implemented and the CMFB loop will affect the settling time of the Op-amp as the bias current is changed. This is due to the inherent CMFB loop having to be stable to ensure a differential pair will work correctly with phase margin. Also, multi-stage folded designs waste current due to extra current branches and increase parasitic capacitances. This in-turn increases power dissipation and reduces maximum frequency of operation.

In further prior art solutions, a pseudo differential cascode amplifier, also termed a grounded source amplifier is utilized. This design has the advantage of having the current sink removed, thus allowing more headroom, greater swing and increased dynamic range. The design also shows how the CMFB circuit can be removed and the inherent switched capacitor circuit can be used to set the common-mode levels of the amplifier. The disadvantage of this design is a reduction in common-mode rejection ratio. Compared to a telescopic design, the power dissipation is the same, thus no power reduction techniques have been employed apart from removing the CMFB circuit.

Further embodiments employ dynamic current biasing in a folded cascode Op-amp using a differential pair. As per the normal telescopic design, the issues here are slow settling times related to CMFB loop dynamics. For low frequencies of operation this technique and a differential input stage is acceptable, but where fast settling is required, then CMFB interaction limits the overall performance. However, the main advantage is a significant decrease in overall current, as the current is modulated relative to the switched capacitor mode.

Further embodiments achieve high gain with the use of regulated cascades. This gain enhancement technique allows gains in excess of 70 dB while only using 1 gain stage. The advantage of this is that the overall power dissipation is lowered as only a single stage is required. Also, the settling time is improved due to reduced parasitics. The disadvantage is that the designs are more focused on gain enhancement, so although current is saved, they are still based on a folded input stage, and thus current is wasted in the folding.

Another technique is the use of switched capacitor biased Op-amps. Here the input stage current sink is replaced with a capacitor. During the hold phase the capacitor is disconnected and charged to a potential, and during the sampling phase, the capacitor is reconnected to the input pair. When the capacitor is first connected, the input pair can supply a significant amount of current before the capacitor charge is reduced. The amplifier can thus drive significant capacitive loads. As the bias capacitor charge reduces, the input pair gm increases until just as the capacitor charge is almost zero, where the gm is maximal (gm proportional to 1/I). As such, extremely high gains are achieved. Thus the ability to drive large capacitive loads (also gives good settling) with high gain and reduced power is achieved. The disadvantage is that the present Op-amps are single-ended, as fully differential designs require CMFB, which is significantly affected by the extreme current variations in the input pair during the bias capacitor charge/discharge cycle.

Referring back to the telescopic Op-amp of FIG. 1, a number of approaches have been attempted to reduce the telescopic Op-amp power dissipation further, including bias line pumping among others, but the majority affect the Common-Mode Feedback circuit. The most promising approach appears to be based on dynamically changing the Op-amp standing current in its sampling, amplification and holding operations. By doing this, the telescopic 3.7 mA standing could be reduced to approx 1.975 mA average (assuming a 50% duty cycle and 3.7 mA/250 uA for amplify/hold.) The implementation involves having additional current sink/sources in the Op-amp, which are switched on and off when power is required or can be saved.

Simulation results of the dynamic biased telescopic Op-amp show that to achieve a switched capacitor settling time of <10 ns, that the timing error when dynamically changing the current, should be no more than 100 ps and that the current match between sinks/sources should be 1% or better. The reason for this is that the current sink can turn on just before the sources or vice-versa, and cause the common-mode output voltage to change. This output voltage perbutation is evident as a settling response dominated by the CMFB characteristics. The CMFB is also affected by mismatch in sink source currents, as the CMFB corrects for any discrepancy in current between sinks and sources and again shows itself as a settling response in the outputs.

Thus far, the transistor level circuits attempting to implement a less than 1% match in sink/source with a timing error less than 200 ps have not been achieved. This can be attributed mainly due to the fact that achieving these goals requires complex circuits, which in-turn dissipates power. Thus, the overall reduction in power is reduced while its complexity and size increase significantly. As such, use of the telescopic gain enhanced dynamic biased Op-amp is not feasible.

As such, no techniques have as yet been devised to give low power dissipation while ensuring fast settling times and high dc gain of the switched capacitor fully differential Op-amp.

SUMMARY

A high-speed low-power dynamic current biased operational amplifier (Op-amp) for use in switched capacitor circuits is herein disclosed. The system and method reduces current in the reset process of the switched capacitor circuit's operation, while maintaining the drive current required for fast settling in the amplification process. The system and method significantly lowers the power consumption of the switched capacitor circuit, while overcoming the main issues related to dynamic current biasing in an Op-amp, common-mode feedback interaction, using architecture other than the standard differential input stage of a normal Op-amp.

In one aspect of the present invention, an operational amplifier for use in a switched capacitor circuit comprises a grounded source operational amplifier circuit and a dynamic current switching circuit coupled to the grounded source operational amplifier circuit, wherein the dynamic current switching circuit is configured to reduce power dissipation in the operational amplifier circuit. The grounded source operational amplifier circuit includes a main amplifier core circuit and a biasing circuit.

The operational amplifier further comprises an upper gain enhancement circuit including a first PMOS cascode, a second PMOS cascode and an AUXP operational amplifier, wherein the upper gain enhancement circuit maintains an upper gain bias voltage across a first PMOS current sources and a second PMOS current source. The upper gain bias voltage is 500 mV.

The operational amplifier further comprises a lower gain enhancement circuit including a first NMOS cascode, a second NMOS cascode and an AUXN operational amplifier, wherein the lower gain enhancement circuit maintains a lower gain bias voltage across a main input pair. The lower gain bias voltage is 400 mV. The dynamic current switching circuit includes a main mirror diode, a main fixed current source, a first current switch and a second current switch.

The operational amplifier further comprises a first main leg and a second main leg in a branch of the main amplifier core circuit, wherein the first main leg and the second main leg are configured such that an input pair bias current and an output pair bias current flow in the branch. When the operational amplifier circuit is in a reset state, an input signal is high, and the second current switch directs a reset current through its drain, thereby allowing none of the reset current to flow through the main mirror diode and through each of the first main leg and the second main leg. The reset current flowing through each of the first main leg and the second main leg is 250 uA. When the operational amplifier circuit is in an amplification state, the input signal is low, and the second current switch is off, thereby allowing an amplification current to flow through the main mirrored diode, the first current switch, the second current switch, and each of the first main leg and the second main leg. The amplification current flowing through each of the first main leg and the second main leg is 1.2 mA. A common mode output voltage is set to 1.5V and a common mode input voltage is set to 1.1V.

In another aspect of the present invention, a method of processing a signal in an operational amplifier comprises amplifying the signal with a main amplifier core circuit, the main amplifier core circuit including a first main leg and a second main leg in a branch of the main amplifier core circuit, biasing the signal with a biasing circuit and reducing power dissipation with a dynamic current switching circuit coupled to the grounded source operational amplifier circuit. The main amplifier core circuit includes an upper gain enhancement circuit including a first PMOS cascode, a second PMOS cascode and an AUXP operational amplifier, further wherein the upper gain enhancement circuit maintains an upper gain bias voltage across a first PMOS current sources and a second PMOS current source.

The main amplifier core circuit includes a lower gain enhancement circuit including a first NMOS cascode, a second NMOS cascode and an AUXN operational amplifier, further wherein the lower gain enhancement circuit maintains a lower gain bias voltage across a main input pair. The upper gain bias voltage is 500 mV. The lower gain bias voltage is 400 mV. The dynamic current switching circuit includes a main mirror diode, a main fixed current source, a first current switch and a second current switch.

When the operational amplifier circuit is in a reset state, an input signal is high, and the second current switch directs a reset current through its drain, thereby allowing none of the reset current to flow through the main mirror diode and through each of the first main leg and the second main leg. The reset current flowing through each of the first main leg and the second main leg is 250 uA. When the operational amplifier circuit is in an amplification state, the input signal is low, and the second current switch is off, thereby allowing an amplification current to flow through the main mirrored diode, the first current switch, the second current switch, and each of the first main leg and the second main leg. The amplification current flowing through each of the first main leg and the second main leg is 1.2 mA. A common mode output voltage is set to 1.5V and a common mode input voltage is set to 1.1V.

DETAILED DESCRIPTION OF THE EMBODIMENTS

Figure 2:
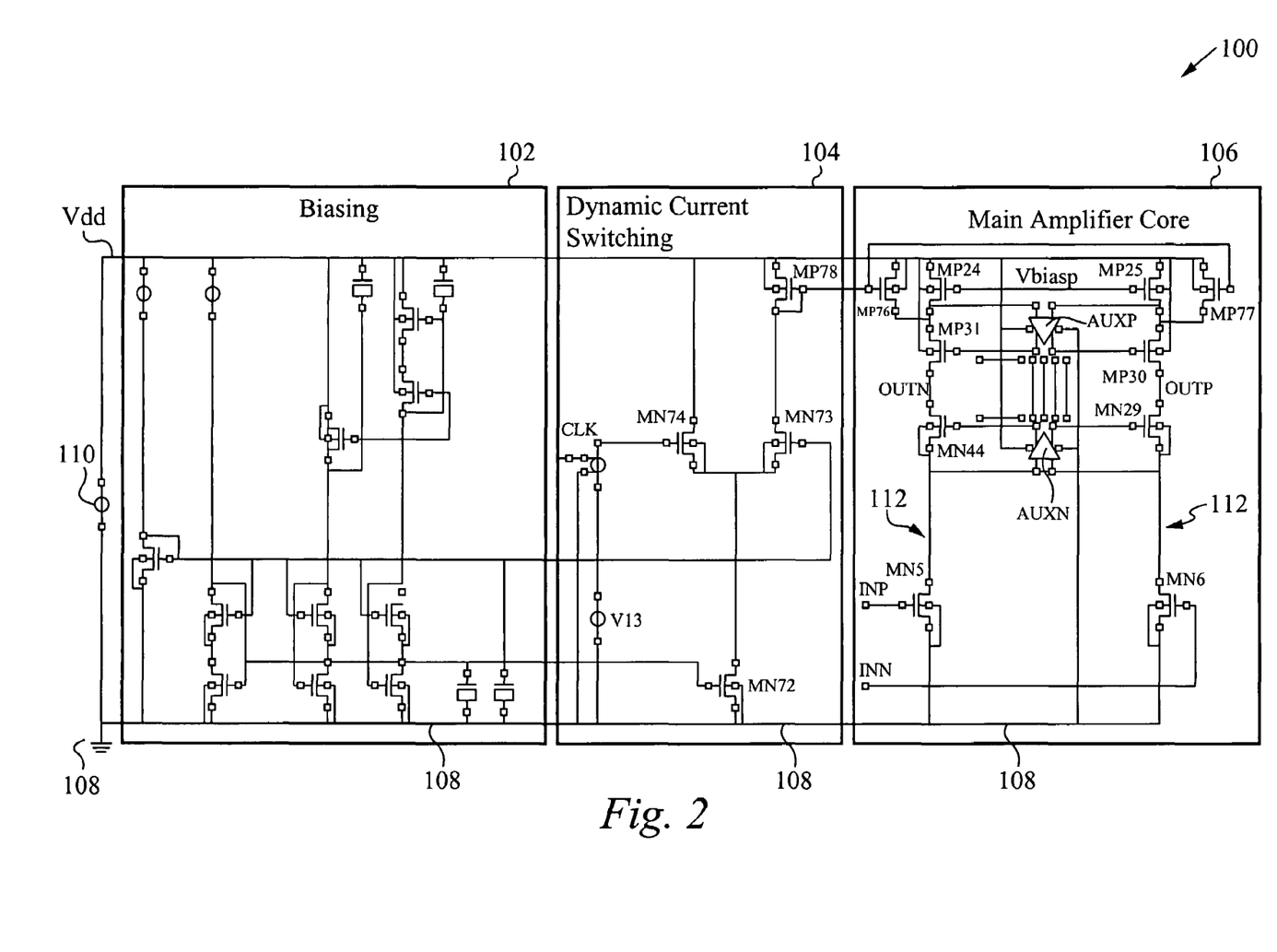
FIG. 2 illustrates a schematic diagram of a switched capacitor circuit.

A high-speed low-power dynamic current biased operation amplifier (Op-amp) for use in switched capacitor circuits is herein disclosed. An embodiment of the Op-amp is depicted in FIG. 2. The grounded source Op-amp 100 differs from a normal differential pair in that the current sink coupled to the input transistor pairs M5, M6 coupled sources is removed. This single factor of removing the current sink means that the Op-amp 100 current can be changed dynamically while having none of the current sink source interaction of the dynamic biased telescopic Op-amp. Also like the telescopic Op-amp, the static current efficiency is 100%, thus helping to ensure that the dynamic biased Op-amp 100 has the lowest current consumption possible. The common-mode input voltage defines the output common-mode voltage and as such, a new common-mode feed back (CMFB) circuit is required. With proper design, this CMFB circuit has been designed to have minimal affect on settling time. In specific switched capacitor arrangements it has been shown that the actual Op-amp 100 does not require any intrinsic CMFB.

Referring to FIG. 2, an embodiment of an Op-amp 100 of the invention is depicted. The Op-amp 100 includes a biasing circuit 102, a dynamic current switching circuit 104 coupled to the biasing circuit 102, and a main amplifier core 106 coupled to the dynamic current switching circuit 104. The dynamic current switching circuit includes a main micro diode MP78, having a drain and a gate coupled to a voltage supply Vdd. The drain of the main mirror diode MP78 is coupled to the gate of the main mirror diode MP78 and to the drain of the current switch MN73. A gate of the main micro diode MP78 is coupled to a gate of a main current transistor MP76 in the main amplifier core circuit 106 and to a gate of a main current transistor MP77. The gate of the current switch MN73 is coupled to the biasing circuit 102. The source of the current switch MN73 is coupled to the source of a current switch MN74. The drain of the current switch MN74 is coupled to the voltage supply Vdd. The gate of the current switch MN74 is coupled to a clock CLK. The clock CLK is coupled to ground 108 and to a voltage source V13. The voltage source V13 is also coupled to ground 108. The drain of the main fixed current source MN72 is coupled to the sources of the current switches MN73 and MN74. The gate of the main fixed current source MN72 is coupled to the biasing circuit 102. The gate and the source of the main fixed current source MN72 is coupled to the biasing circuit 102.

Figure 3:
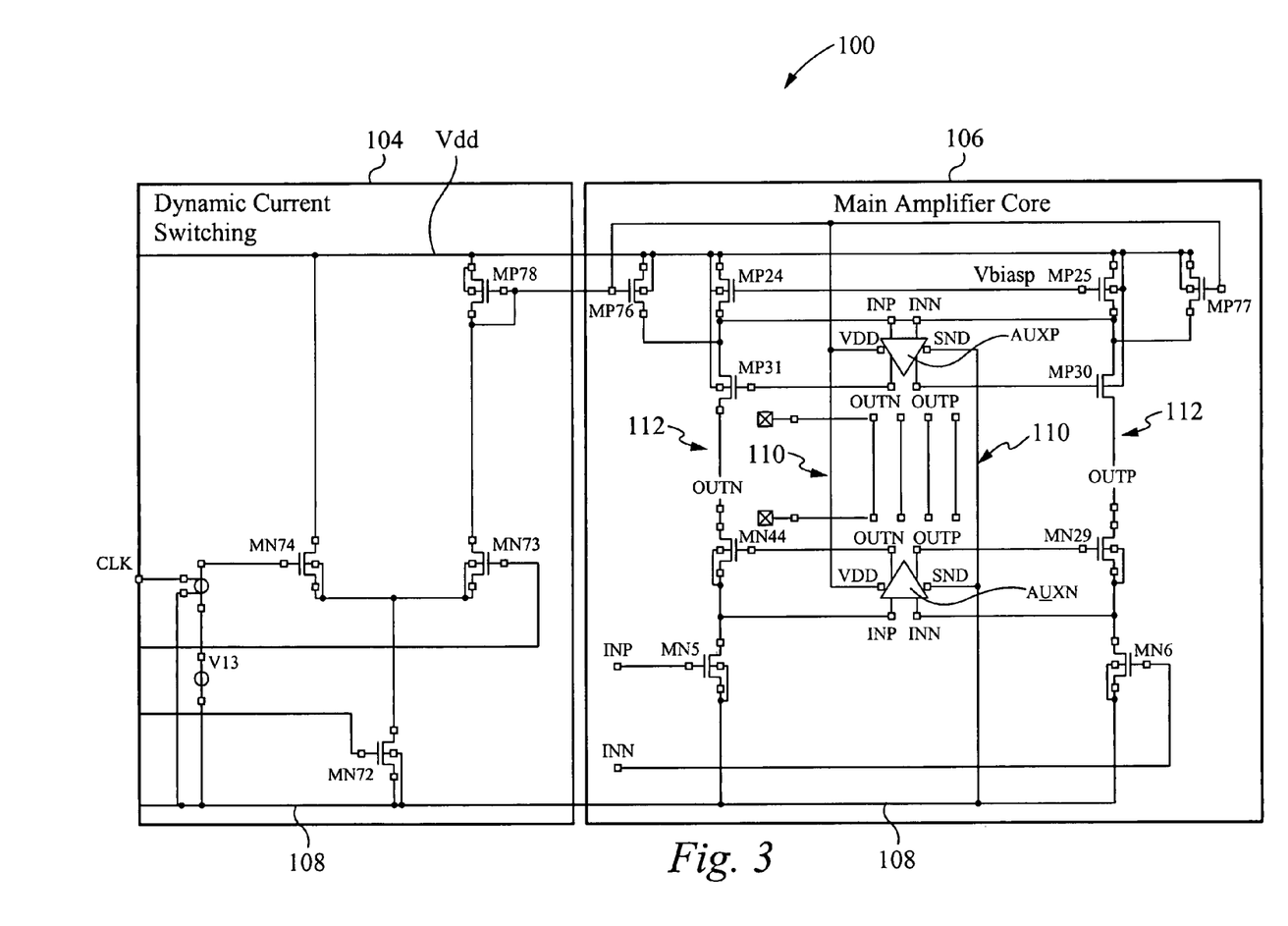
FIG. 3 illustrates a schematic diagram of a dynamic current switching circuit and a main amplifier core circuit.

FIG. 3 is the Op-amp 100, showing only the dynamic current switching circuit 104 and the main amplifier core 106 in greater detail. Referring to FIG. 2 and FIG. 3 simultaneously, the main amplifier core circuit 106 includes two common gate PMOS current sources MP24, MP25. The gate of the PMOS current source MP24 and the gate of the PMOS current source MP25 are coupled to the biasing circuit 102 by the voltage bias Vbiasp. The drain of the PMOS current source MP24 is coupled to the drain of the main current transistor MP76, the source of the PMOS cascode MP31 and an input node INP of the operational amplifier AUXP. The drain of the PMOS current source MP25 is coupled to the drain of the main current transistor MP77, the source of the PMOS cascode MP30 and an input node INN of the operation amplifier AUXP. The sources of the PMOS current sources MP24, MP25 are coupled to the voltage supply Vdd. The gates of the PMOS cascodes MP30, MP31 are coupled to the output nodes OUTP, OUTN, respectively, of the operational amplifier AUXP.

Still referring to FIG. 2 and FIG. 3 simultaneously, the drains of the PMOS cascodes MP31, MP30 are coupled to the drains of the NMOS cascodes MN44, MN29, respectively. These connections are the outputs OUTN, OUTP, respectively, of the Op-amp 100. The gates of the NMOS cascodes MN44, MN29 are coupled to the output nodes OUTN, OUTP, respectively, of the operational amplifier AUXN and to the sources of the NMOS cascodes MN44, MN29, respectively. The sources of the NMOS cascodes MN44, MN29 are coupled to the input nodes INP, INN, respectively, of the same operational amplifier AUXN, and to the drains of the input transistor pair MN5, MN6, respectively. The input nodes INP, INN of the Op-amp 100 are coupled to the gates of the input transistor pair MN5, MN6, respectively, and the sources of the input transistor pair MN5, MN6 are coupled to ground 108 and to the gates of the input transistor pair MN5, MN6, respectively.

Referring back to FIG. 2, the main current transistors MP76, MP77 have a common gate configuration. Furthermore, the sources of the main current transistors MP76, MP77 are coupled to the voltage supply Vdd. An external voltage source 110 provides the supply voltage Vdd and is coupled to ground 108.

Again, the grounded source input pair Op-amp 100 has the advantages of the differential pair but with the capability of being able to implement dynamic current biasing due to minimal CMFB, as only PMOS current sources MP24, MP25 are used to define the main Op-amp branch 112 currents. Preferably, the approximate current saving of a grounded source dynamic biased Op-amp 100 is forty percent (40%) over the present best telescopic design (FIG. 1), in other words, 2.1 mA for the Grounded Source Op-amp 100 compared to 3.7 mA for the Telescopic.

Thus, the use of a grounded source Op-amp 100 minimizes settling time issues related to CMFB, while the Op-amp 100 employs dynamic current biasing to reduce power dissipation. In this manner high gain, settling time and lower power can all be achieved concurrently.

Referring now to FIG. 3, in an embodiment of the invention, the main amplifier core 106 of the Op-amp consists of two main legs 112 as per the telescopic (FIG. 1), thus the static one hundred percent (100%) current efficiency as the input transistor pair MN5, MN6 bias currents and output currents flow in the same branch. The current is supplied by the two PMOS current sources MP24, MP25, whose current is defined by an "m factor" from the biasing circuit 102. This is set at m=10 and the default bias current is 25 uA, thus 250 uA initially flows down each leg 112. This is the reset state current.

Still referring to FIG. 3, an embodiment of the invention also includes PMOS Cascodes MP30, MP31 along with the Op-amp AUXP which define the upper gain-enhancement circuit. The bias voltage for the Op-amp AUXP is derived from the biasing circuit 102, such that in an embodiment, approximately 500 mV is kept across the PMOS current sources MP24, MP25. Also in an embodiment, the NMOS Cascodes MN29, MN44 along with the Op-amp AUXN define the lower gain-enhancement circuit. Again, as per the upper gain enhancement circuit, the bias voltage for the Op-amp AUXN is derived from the biasing circuit 102, such that approximately 400 mV is kept across the input transistor pair MN5, MN6. In another embodiment, the common-mode output voltage is nominally kept at 1.5V while the input common-mode is set to 1.1V.

Still referring to FIG. 3, an embodiment of the invention also includes the input transistor pair MN5, MN6 having a Vds as set by the lower gain-enhancement circuit via its bias voltage. Preferably, the leg current is set so the reset gm is approx 5.2 mS. When in the amplification state, an extra 950 uA is driven into each leg 112, in other words, 1.2 mA versus the 250 uA in reset state. This gives a gm of 17.07 mS for the input transistor pair MN5, MN6 respectively.

In an embodiment of the invention, the additional current is supplied by the dynamic current switching circuit 104, with the main current transistors being the main current transistors MP76, MP77. Also in an embodiment, these transistors mirror the current of the main mirror diode MP78 with an "m-factor" of 6 and deliver the extra 950 uA per leg 112. Also in an embodiment, the main mirror diode MP78 runs at approx 250 uA. The mirror arrangement of the main current transistors MP76, MP77, and the main micro diode MP78 is not optimum, as the main mirror diode MP78 is running at 250 uA, but the main current transistors MP76, MP77 are seeing approximately 160 uA×6. This is attributed to the differing drain-to-source voltage VDS of the main micro diode MP78 compared to the main current transistors MP76, MP77, and also the fact they are running small lengths of l=0.5 um to minimize capacitance and maximize speed.

Still referring to FIG. 3, the main dynamic current switching circuit 104 is defined by the main micro diode MP78, the main fixed current source MN72 and the current switches MN73, MN74. The current switch MN74 has one of the main switched capacitor clock phases coupled to its gate, whereas the gate of the current switch MN73 is tied to a bias voltage as defined by the biasing circuit 102. When the input signal is high, the current switch MN74 directs all the current, preferably 250 uA through its drain and no current flows through the main mirror diode MP78. Thus the Op-amp 100 is in the reset state. When the input goes low, the current switch MN74 is off and the current flows through the main fixed current source MN72, the current switch MN73 and the main mirror diode MP78. As the current switch MN73 is coupled to a fixed bias voltage and sized appropriately, it acts as a cascode for the main fixed current source MN72, thus an accurate bias current is passed through the main mirror diode MP78. The Op-amp 100 is thus in its amplification state.

Therefore, the resulting operating current, taking bias currents, yield-enhancement Op-amps, reset and amplification currents, in an embodiment, are 3 mA for amplification and 1.466 mA for reset, with an average current of 2.228 mA. By careful choice of bias currents, this can be lowered so that an overall average of 2 mA is attained.

Figure 4:
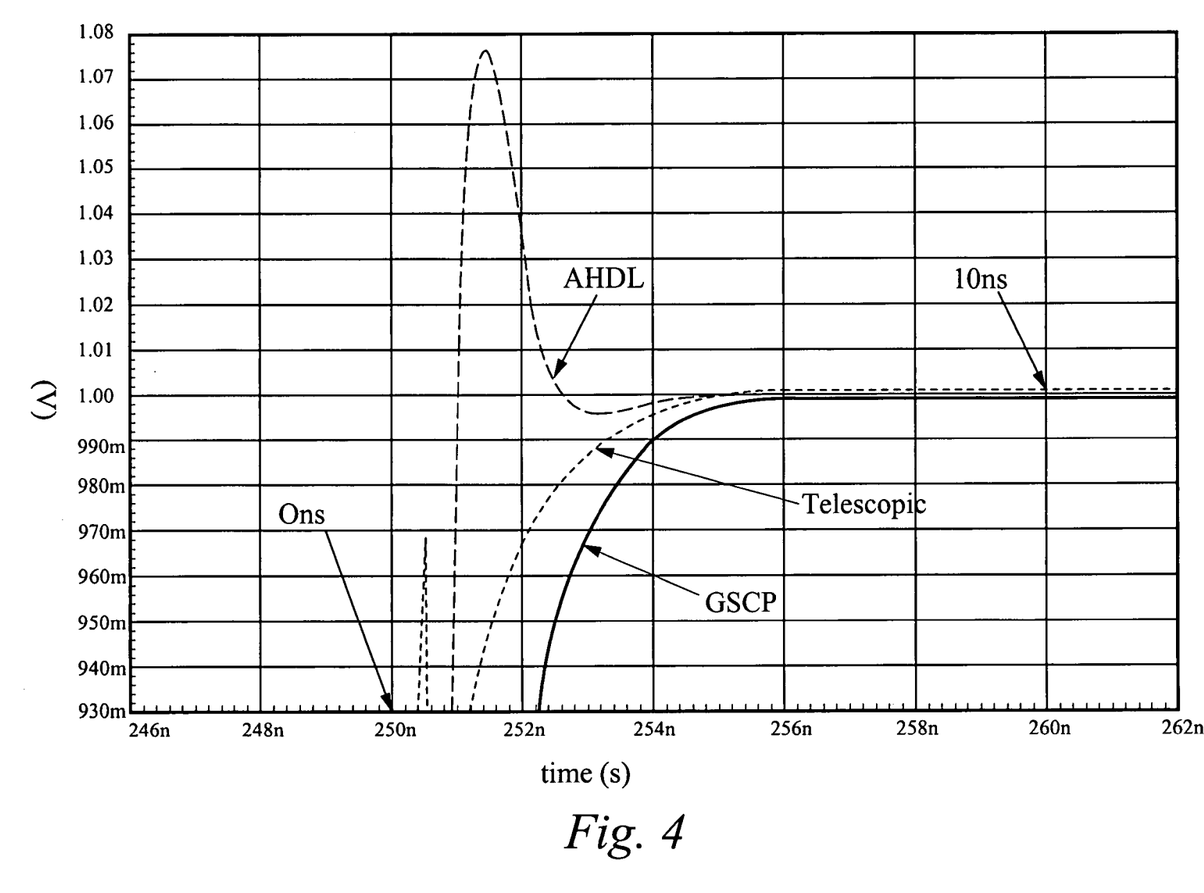
FIG. 4 illustrates a graphical representation of a zoomed in positive settling transient.

Referring to FIG. 4, a graphical representation of the positive settling transient of an embodiment of the invention is depicted. Here, in a 10nS range defined from 250 n to 260 n on the time axis (time (s)), the prior art (Telescopic) curve displays an acceptable settling time for use in a switched capacitor circuit. Also, the AHDL curve is illustrated, which is the curve for an ideal theoretical op-amp modeled by an analog description language, VerilogA. As discussed previously, an Op-amp must settle in a required short amount of time and within a desired accuracy. Referring back to FIG. 4, the settling curve (GSCP) displays that the settling time for the Op-amp 100 occurs at the same time (256 n) and at almost exactly the same voltage level (1.00 v), as shown by the voltage axis (V).

Figure 5:
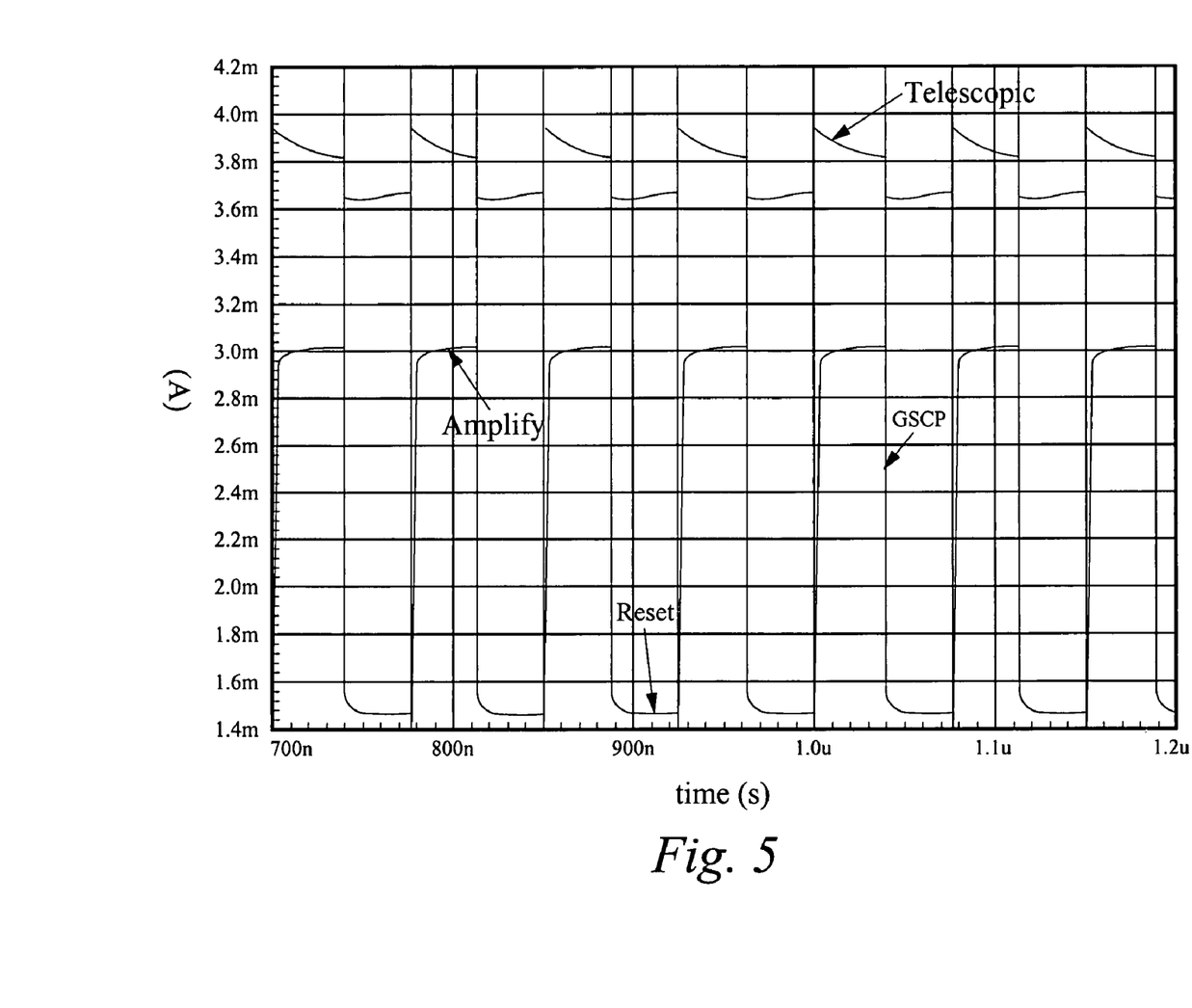
FIG. 5 illustrates a graphical current consumption comparison between the prior art and the high-speed low-power dynamic current biased Op-amp.

Referring now to FIG. 5, a graphical representation of the current consumption of an embodiment of the invention is depicted. In FIG. 5, the current consumed is shown on the (A) axis, while the operation time is shown on the (time(s)) axis. The prior art current consumption is depicted by the (Telescopic) curve, showing that such an amplifier design consumes no less than 3.6 mA at any given point of operation, and at times, up to 4.0 mA. In the curve depicting an embodiment of the invention (GSCP), it is shown that in the amplification state (Amplify), where the most current is consumed, the GSCP only consumes slightly more than 3.0 mA. Furthermore, in the reset state (Reset), the GSCP consumes less than 1.5 mA.

In operation, the Op-amp 100 uses a grounded source Op-amp 100, including a biasing circuit 102 and a main amplifier core 106 to minimize settling time issues related to CMFB, while the Op-amp 100 employs a dynamic current switching circuit 104 to reduce power dissipation. In this manner of operation, the Op-amp 100 achieves what the prior art can not, that is, high gain and settling time, with concurrent lower power dissipation.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications can be made in the embodiment chosen for illustration without departing from the spirit and scope of the invention. Specifically, it will be apparent to one of ordinary skill in the art that the device of the present invention could be implemented in several different ways and have several different appearances.

What is claimed is:

1. An operational amplifier for use in a switched capacitor circuit, the operational amplifier comprising:
a grounded source operational amplifier circuit;
a dynamic current switching circuit coupled to the grounded source operational amplifier circuit, wherein the dynamic current switching circuit is configured to reduce power dissipation in the grounded source operational amplifier circuit; and
an upper gain enhancement circuit including a first PMOS cascode, a second PMOS cascode, and an AUXP operational amplifier, wherein the upper gain enhancement circuit maintains an upper gain bias voltage across a first PMOS current source and across a second PMOS current source.

2. The operational amplifier according to claim 1, wherein the grounded source operational amplifier circuit includes:
a main amplifier core circuit; and
a biasing circuit.

3. The operational amplifier according to claim 1, wherein the upper gain bias voltage is about 500 mV.

4. The operational amplifier according to claim 1, further comprising a lower gain enhancement circuit including a first NMOS cascode, a second NMOS cascode and an AUXN operational amplifier, wherein the lower gain enhancement circuit maintains a lower gain bias voltage across a main input pair.

5. The operational amplifier according to claim 4, wherein the lower gain bias voltage is about 400 mV.

6. The operational amplifier according to claim 1, wherein the dynamic current switching circuit includes:
a main mirror diode;
a main fixed current source;
a first current switch; and
a second current switch.

7. An operational amplifier for use in a switched capacitor circuit, the operational amplifier comprising:
a grounded source operational amplifier circuit, wherein the grounded source operational amplifier circuit includes:
a main amplifier core circuit; and
a biasing circuit;
a dynamic current switching circuit coupled to the grounded source operational amplifier circuit, wherein the dynamic current switching circuit is configured to reduce power dissipation in the grounded source operational amplifier circuit; and a first main leg and a second main leg in a branch of the main amplifier core circuit, wherein the first main leg and the second main leg are configured such that an input pair bias current and an output pair bias current flow in the branch.

8. The operational amplifier according to claim 7, wherein when the grounded source operational amplifier circuit is in a reset state and an input signal is high, then the second current switch directs a reset current through its drain, thereby allowing none of the reset current to flow through the main mirror diode, the first main leg, and the second main leg.

9. The operational amplifier according to claim 8, wherein the reset current flowing through each of the first main leg and the second main leg is about 250 µA.

10. The operational amplifier according to claim 7, wherein when the grounded source operational amplifier circuit is in an amplification state and the input signal is low, then the second current switch is off, thereby allowing an amplification current to flow through the main mirrored diode, the first current switch, the second current switch, the first main leg, and the second main leg.

11. The operational amplifier according to claim 10, wherein the amplification current flowing through each of the first main leg and the second main leg is about 1.2 mA.

12. The operational amplifier according to claim 2, wherein a common mode output voltage is about 1.5V.

13. The operational amplifier according to claim 2, wherein a common mode input voltage is about 1.1V.

14. An operational amplifier for use in a switched capacitor circuit, the operational amplifier comprising:
a main amplifier core circuit including:
a first main leg and a second main leg in a branch of the main amplifier core circuit, wherein the first main leg and the second main leg are configured such that an input pair bias current and an output pair bias current flow in the branch,
an upper gain enhancement circuit including a first PMOS cascode, a second PMOS cascode, and an AUXP operational amplifier, wherein the upper gain enhancement circuit maintains an upper gain bias voltage across a first PMOS current sources and a second PMOS current source, and
a lower gain enhancement circuit including a first NMOS cascode, a second NMOS cascade, and an AUXN operational amplifier, wherein the lower gain enhancement circuit maintains a lower gain bias voltage across a main input pair;
a biasing circuit; and
a dynamic current switching circuit coupled to the main amplifier core circuit,
wherein the dynamic current switching circuit is configured to reduce power dissipation in the main amplifier core circuit.

15. The operational amplifier according to claim 14, wherein the upper gain bias voltage is about 500 mV.

16. The operational amplifier according to claim 14, wherein the lower gain bias voltage is about 400 mV.

17. The operational amplifier according to claim 14, wherein the dynamic current switching circuit includes:
a main mirror diode;
a main fixed current source;
a first current switch; and
a second current switch.

18. The operational amplifier according to claim 17, wherein when the main amplifier core circuit is in a reset state and an input signal is high, then the second current switch directs a reset current through its drain, thereby allowing none of the reset current to flow through the main mirror diode, the first main leg, and the second main leg.

19. The operational amplifier according to claim 18, wherein the reset current flowing through each of the first main leg and the second main leg is about 250 µA.

20. The operational amplifier according to claim 17, wherein when the main amplifier core circuit is in an amplification state and the input signal is low, then the second current switch is off, thereby allowing an amplification current to flow through the main mirrored diode, the first current switch, the second current switch, the first main leg, and the second main leg.

21. The operational amplifier according to claim 20, wherein the amplification current flowing through each of the first main leg and the second main leg is about 1.2 mA.

22. The operational amplifier according to claim 14, wherein a common mode output voltage is about 1.5V.

23. The operational amplifier according to claim 14, wherein a common mode input voltage is about 1.1V.

24. An operational amplifier for use in a switched capacitor circuit, the operational amplifier comprising:
a main amplifier core circuit including a first main leg and a second main leg in a branch of the main amplifier core circuit, wherein the main amplifier core circuit includes an upper gain enhancement circuit including a first PMOS cascode, a second PMOS cascode, and an AUXP operational amplifier, and wherein the upper gain enhancement circuit maintains an upper gain bias voltage across a first PMOS current source and a second PMOS current source;
a biasing circuit; and
a dynamic current switching circuit coupled to the main amplifier core circuit,
wherein the dynamic current switching circuit is configured to reduce power dissipation in the operational amplifier circuit.

25. The operational amplifier according to claim 24, wherein the main amplifier core circuit includes a lower gain enhancement circuit including a first NMOS cascode, a second NMOS cascode, and an AUXN operational amplifier, further wherein the lower gain enhancement circuit maintains a lower gain bias voltage across a main input pair.

26. The operational amplifier according to claim 24, wherein the upper gain bias voltage is about 500 mV.

27. The operational amplifier according to claim 24, wherein the lower gain bias voltage is about 400 mV.

28. The operational amplifier according to claim 24, wherein the dynamic current switching circuit includes:
a main mirror diode;
a main fixed current source;
a first current switch; and
a second current switch.

29. The operational amplifier according to claim 28, wherein when the main amplifier core circuit is in a reset state and an input signal is high, then the second current switch directs a reset current through its drain, thereby allowing none of the reset current to flow through the main mirror diode, the first main leg, and the second main leg.

30. The operational amplifier according to claim 29, wherein the reset current flowing through each of the first main leg and the second main leg is about 250 µA.

31. The operational amplifier according to claim 28, wherein when the main amplifier core circuit is in an amplification state and the input signal is low, then the second current switch is off, thereby allowing an amplification current to flow through the main mirrored diode, the first current switch, the second current switch, the first main leg, and the second main leg.

32. The operational amplifier according to claim 31, wherein the amplification current flowing through each of the first main leg and the second main leg is about 1.2 mA.

33. The operational amplifier according to claim 24, wherein a common mode output voltage is about 1.5V.

34. The operational amplifier according to claim 24, wherein a common mode input voltage is about 1.1V.

35. A method of processing a signal in an operational amplifier, the method comprising:
   amplifying the signal with a main amplifier core circuit, the main amplifier core circuit including a first main leg and a second main leg in a branch of the main amplifier core circuit, wherein the main amplifier core circuit includes an upper gain enhancement circuit including a first PMOS cascode, a second PMOS cascode, and an AUXP operational amplifier, and wherein the upper gain enhancement circuit maintains an upper gain bias voltage across a first PMOS current source and a second PMOS current source;
   biasing the signal with a biasing circuit; and
   reducing power dissipation with a dynamic current switching circuit coupled to the main amplifier core circuit.

36. The method according to claim 35, wherein the main amplifier core circuit includes a lower gain enhancement circuit including a first NMOS cascode, a second NMOS cascode, and an AUXN operational amplifier, further wherein the lower gain enhancement circuit maintains a lower gain bias voltage across a main input pair.

37. The method according to claim 35, wherein the upper gain bias voltage is about 500 mV.

38. The method according to claim 35, wherein the lower gain bias voltage is about 400 mV.

39. The method according to claim 35, wherein the dynamic current switching circuit includes:
   a main mirror diode;
   a main fixed current source;
   a first current switch; and
   a second current switch.

40. The method according to claim 39, further comprising preventing reset current from flowing through the main mirror diode, the first main leg, and the second main leg when the main amplifier core circuit is in a reset state, an input signal is high, and the second current switch directs a reset current through its drain.

41. The method according to claim 40, wherein the reset current flowing through each of the first main leg and the second main leg is about 250 µA.

42. The method according to claim 39, wherein when the main amplifier core circuit is in an amplification state and the input signal is low, then the second current switch is off, thereby allowing an amplification current to flow through the main mirrored diode, the first current switch, the second current switch, the first main leg, and the second main leg.

43. The method according to claim 42, wherein the amplification current flowing through each of the first main leg and the second main leg is about 1.2 mA.

44. The method according to claim 35, wherein a common mode output voltage is about 1.5V.

45. The method according to claim 35, wherein a common mode input voltage is about 1.1V.

* * * * *